(12) United States Patent
Torheim et al.

(10) Patent No.: US 7,952,355 B2
(45) Date of Patent: May 31, 2011

(54) APPARATUS AND METHOD FOR RECONSTRUCTING AN MR IMAGE

(75) Inventors: Geir Torheim, Oslo (NO); Giovanni Sebastiani, Rome (IT)

(73) Assignee: General Electric Company, Schenectady, NY (US)

( * ) Notice: Subject to any disclaimer, the term of this patent is extended or adjusted under 35 U.S.C. 154(b) by 205 days.

(21) Appl. No.: 12/362,560

(22) Filed: Jan. 30, 2009

(65) Prior Publication Data

US 2010/0194392 A1    Aug. 5, 2010

(51) Int. Cl.
*G01V 3/00*    (2006.01)
(52) U.S. Cl. .......................................... 324/318; 324/309
(58) Field of Classification Search .......... 324/300–322; 600/407–445
See application file for complete search history.

(56) References Cited

U.S. PATENT DOCUMENTS

| | | | | |
|---|---|---|---|---|
| 5,289,126 A * | 2/1994 | Mori et al. | ..................... | 324/309 |
| 7,078,899 B2 * | 7/2006 | Dale et al. | ..................... | 324/314 |
| 7,289,653 B2 * | 10/2007 | Zhang et al. | ................... | 382/131 |
| 7,378,660 B2 * | 5/2008 | Case et al. | ............... | 250/363.01 |
| 7,447,382 B2 * | 11/2008 | Nestares et al. | ............... | 382/299 |
| 7,626,389 B2 * | 12/2009 | Fiedler et al. | ................. | 324/309 |
| 7,643,864 B2 * | 1/2010 | Elgort et al. | ................... | 600/410 |
| 7,714,582 B2 * | 5/2010 | Hagen et al. | ................... | 324/322 |
| 2005/0226482 A1 * | 10/2005 | Kuduvalli | ..................... | 382/128 |
| 2009/0060841 A1 * | 3/2009 | Yen et al. | ........................ | 424/9.3 |
| 2010/0204563 A1 * | 8/2010 | Stodilka et al. | ............... | 600/411 |

OTHER PUBLICATIONS

Dixon, "Simple Proton Spectroscopic Imaging," RSNA, Oct. 1984, pp. 189-194.
Reeder et al., "Multicoil Dixon Chemical Species Separation With an Iterative Least-Squares Estimation Method," Magnetic Resonance in Medicine, 2004, pp. 34-45.

* cited by examiner

*Primary Examiner* — Brij B Shrivastav
(74) *Attorney, Agent, or Firm* — Ziolkowski Patent Solutions Group, SC

(57) ABSTRACT

An MR imaging apparatus is disclosed, wherein the MR imaging apparatus includes a plurality of gradient coils positioned about a bore of a magnet, and an RF transceiver system controlled by a pulse module to transmit RF signals to an RF coil assembly. The MR imaging apparatus also includes a controller coupled to the plurality of gradient coils and the RF transceiver system and programmed to obtain MR image signals at different echo times from a subject containing metabolites having known characteristics. The controller is further programmed to reconstruct images of the metabolites in a selected region of interest (ROI) using a probabilistic mathematical expression based on known information regarding an image acquisition process and using a spatial distribution of the metabolites to account for artifacts in the images.

24 Claims, 2 Drawing Sheets

APPARATUS AND METHOD FOR RECONSTRUCTING AN MR IMAGE

BACKGROUND OF THE INVENTION

The invention relates generally to a method of image reconstruction in an MR system, and more particularly, to a method of image reconstruction of multi-echo MR data using a probabilistic mathematical expression to generate an MR image having reduced image artifacts.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Magnetic resonance (MR) imaging of hyperpolarized substances such as carbon-13 has received interest for a variety of in vivo imaging applications. However, such imaging is subject to a rapid loss of magnetization of the hyperpolarized substances, which may be further affected when multiple substances having different chemical shift are imaged.

One method for imaging the carbon-13 isotopes, for example, uses an echo planar spectroscopic imaging technique that requires the acquisition of large amounts of data. A large amount of data is needed to obtain significant spectral resolution when a Fourier transform is performed on the data to produce a spectrum. However, as a result of the large amount of data that is acquired in order to achieve this spatial resolution, scan times must be increased accordingly, which is undesirable in many imaging scenarios.

It would therefore be desirable to have a system and method capable of reconstructing multi-echo data in a computationally efficient manner to form MR images having few artifacts.

BRIEF DESCRIPTION OF THE INVENTION

In accordance with one aspect of the invention, an MR imaging apparatus includes a plurality of gradient coils positioned about a bore of a magnet, and an RF transceiver system controlled by a pulse module to transmit RF signals to an RF coil assembly. The MR imaging apparatus also includes a controller coupled to the plurality of gradient coils and the RF transceiver system and programmed to obtain MR image signals at different echo times from a subject containing metabolites having known characteristics. The controller is further programmed to reconstruct images of the metabolites in a selected region of interest (ROI) using a probabilistic mathematical expression based on known information regarding an image acquisition process and using the spatial distribution of the metabolites to account for artifacts in the images.

In accordance with another aspect of the invention, a method of MR imaging comprises selecting a region of interest (ROI) of a subject to be imaged, the selected ROI comprising metabolites having known characteristics, obtaining MR image signals at different echo times from the selected ROI, and reconstructing images of the metabolites in the selected ROI via a probabilistic mathematical expression using known information regarding an image acquisition process and using a spatial distribution of the metabolites to account for artifacts in the images.

In accordance with another aspect of the invention, a computer program is stored on a computer readable storage medium, the computer program comprising instructions, which, when executed by a computer, cause the computer to obtain an MR signal matrix from an object comprising metabolites having known characteristics, reconstruct an image of the metabolites using a probabilistic mathematical expression based on known information regarding an image acquisition process and incorporating a spatial distribution of the metabolites to account for artifacts in the images.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

A system and method is shown to perform MR image reconstruction using a probabilistic mathematical model that relies upon known, or a priori, information regarding the spatial distribution of the hyperpolarized substances being imaged. This probabilistic mathematical expression accounts for various artifacts that may be present by using a parametric model for the measured signals.

Figure 1:
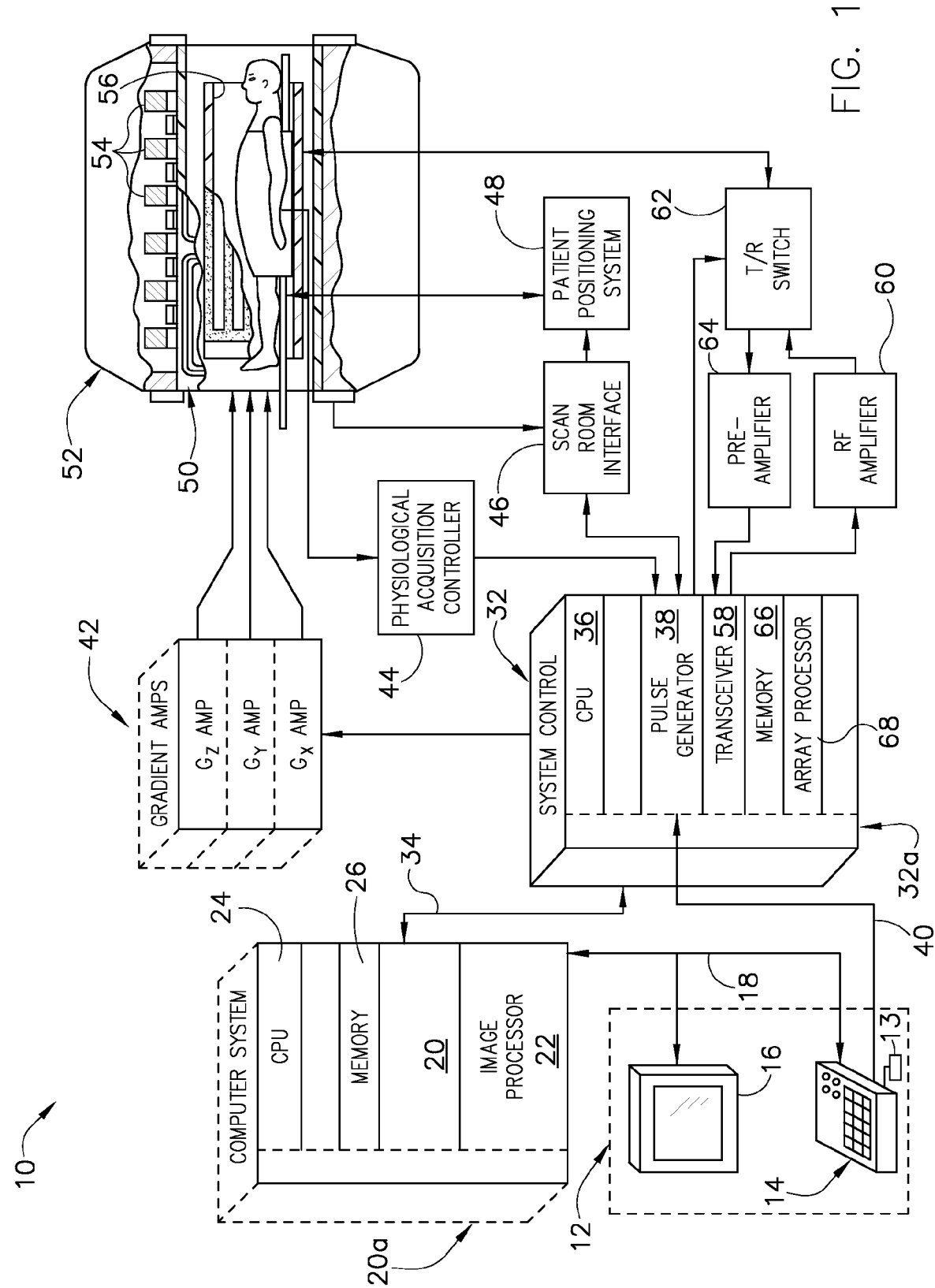
FIG. 1 is a schematic block diagram of an exemplary MR imaging system for use with an embodiment of the invention.

Referring to FIG. 1, the major components of a preferred magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

As discussed above, MR imaging of hyperpolarized substances is often challenging, particularly when multiple substances having different chemical shifts are to be imaged. However, using assumed known "a priori" information about the hyperpolarized substances can aid in improving the overall quality of the MR images. Such an approach, known as a Bayesian approach, incorporates prior knowledge in the form of prior probabilities in order to bias the outcome of the MR data in the direction of expectation. Using this Bayesian approach, less data needs to be acquired during an MR imaging sequence. While less acquired data typically leads to images with significant artifacts, the Bayesian approach presented herebelow uses both a priori information and knowledge about the acquisition process to account for many of these artifacts and provide for a high-quality reconstructed image.

To reconstruct MR images of different metabolites that account for various artifacts related to multi-echo data acquisition of hyperpolarized substances, an embodiment of the invention involves the utilization of mathematical expressions incorporating known information with respect to the hyperpolarized substances at a point (x,y) in the image.

A measured MR image signal $S_n(x, y)$ at a point (x,y) may be expressed as follows:

$$S_n(x, y) = \sum_{j=1}^{m} \rho_j(x + \xi_n(\omega_j), y) \quad \text{(Eqn. 1)}$$

$$\exp\left\{ \begin{array}{l} it_n\omega_j + it_n\omega(x + \xi_n(\omega_j), y) + \\ ik[(x + \xi_n(\omega_j))]\left(\frac{1 + (-1)^n}{2}\right) \end{array} \right\} + \epsilon_n(x, y),$$

where $\rho_j$ is the complex weight of the j-th metabolite component, $\omega_j$ is the known frequency of the j-th metabolite, $n=1, \ldots, N$, and N is the total number of echoes, $t_n$ is the echo time, and $\xi_n(\omega_j)$ models the chemical shift, while $\omega$ is due to the magnetic field inhomogeneity in the MRI system. The variables $\epsilon_n$ model the independent additive random errors. Furthermore, $t_n = n\Delta t$. The number m denotes the known number of metabolites. All other variables must be estimated.

As mentioned above, the expression for the measured image signal in Eqn. 1 accounts for various artifacts that may be present therein. Artifacts attributable to a non-zero phase shift, a chemical shift, and/or a time shift between even and odd echoes may all be accounted for using Eqn. 1 above. For example, the term, $\xi_n(\omega_j)$, is given as:

$$\xi_n(\omega_j) = -C(-1)^n(\omega_j - \omega_{j0}), \quad \text{(Eqn. 2)}$$

where $C \geq 0$, C is known, and $\omega_{j0}$, also known, is the reference resonance frequency. This term accounts for a chemical shift artifact. Likewise, artifacts related to a time shift between even and odd echoes can be accounted for simply with the multiplicative term $$\frac{1 + (-1)^n}{2},$$

where again $n=1, \ldots, N$, and N is the total number of echoes. Accordingly, if the value of n is even, the measured image signal may correct for a time shift artifact present in multi-echo image data.

The above general expression for the measured signal shown in Eqn. 1 can be further simplified by neglecting, at first, the chemical shift effect on the image signal. An estimated MR image signal $E[S_n(x_r, y_s)]$ at a point $(x_r, y_s)$, where $r,s=1, \ldots, n_p$, and $n_p$ is the linear dimension of the square image, is expressed as follows:

$$E[S_n(x_r, y_s)] = \quad \text{(Eqn. 3)}$$

$$\exp\left\{i\left[t_n\omega(x_r, y_s) + x_r\left(\frac{1+(-1)^n}{2}\right)k\right]\right\}\sum_{j=1}^{m}\rho_j(x_r, y_s)\exp(it_n\omega_j),$$

where $t_n$ is the echo time (in seconds), $\rho_j$ is the complex weight of the j-th metabolite component, $\omega_j$ is the known frequency of the j-th metabolite (in Hz), n=1, ..., N, and N is the total number of echoes, and $\omega(x_r, y_s)$ is the magnetic field inhomogeneity in the MRI system at point $(x_r, y_s)$. The "E" in Eqn. 3 denotes the expected value of the MR image signal at point $(x_r, y_s)$.

The simplified expression of the estimated MR image signal at Eqn. 3 assumes that there is no chemical shift artifact present in the acquired MR data. Other artifacts, however, are still accounted for. For example, the artifacts related to a time shift between even and odd echoes can be accounted for by the term $$x_r\left(\frac{1+(-1)^n}{2}\right)k,$$

which is linearly dependent on a pixel coordinate along the readout gradient direction, where k is a real number that acts as a scaling parameter to account for time shift artifacts present in the MR data acquired during even echoes in a multi-echo sequence.

Alternatively, the expression for $E[S_n(x_r, y_s)]$ can be made more flexible by replacing the phase factor, $kx_r$, which is linearly dependent on the pixel coordinate along the readout gradient direction, with a completely free phase term $\phi(x_r, y_s)$. Accordingly, the estimated MR image signal can be expressed as follows:

$$E[S_n(x_r, y_s)] = \exp\left\{i\left[t_n\omega(x_r, y_s) + \varphi(x_r, y_s)\left(\frac{1+(-1)^n}{2}\right)\right]\right\} \quad \text{(Eqn. 4)}$$

$$\sum_{j=1}^{m}\rho_j(x_r, y_s)\exp(it_n\omega_j),$$

where $t_n$ is the echo time, $\rho_j$ is the complex weight of the I-th metabolite component, $\omega_j$ is the known frequency of the j-th metabolite, n=1, ..., N, and N is the total number of echoes, $\omega(x_r, y_s)$ is the magnetic field inhomogeneity in the MRI system at point $(x_r, y_s)$, and $\phi(x_r, y_s)$ represents a free phase factor. By using the above Eqn. 4 for the estimated MR image signal, other possible sources of artifacts may be taken into account by the presence of the free phases, which can further improve image quality.

Based on the above expressions for the measured and estimated MR image signals, a probabilistic Bayesian image expression is used to reconstruct MR images of the metabolites for each point $(x_r, y_s)$ in an image. The probabilistic Bayesian image model is given as:

$$P\left(\begin{array}{c} \rho(x_1, y_1), \omega(x_1, y_1), \ldots, \rho(x_{n_p}, y_{n_p}), \omega(x_{n_p}, y_{n_p}), \\ k \mid S_1(x_1, y_1), \ldots, S_1(x_{n_p}, y_{n_p}), \ldots, \\ S_N(x_1, y_1), \ldots, S_N(x_{n_p}, y_{n_p}) \end{array}\right) \propto \quad \text{(Eqn. 5)}$$

$$\prod_{n=1}^{N}\prod_{r=1}^{n_p}\prod_{s=1}^{n_p}\exp-|S_n(x_r, y_s) - E[S_n(x_r, y_s)]|^2/2$$

$$\sigma^2 \cdot \prod_{j=1}^{m}\exp\left\{-\beta_1\sum_{(r',s')\in\partial_{(r,s)}}\log\left[\frac{1+|\rho_j(x_{r'}, y_{s'})-\rho_j(x_r, y_s)|^2/\delta_1^2}{}\right]\right\}\cdot\exp$$

$$\left\{-\beta_2\sum_{(r',s')\in\partial_{(r,s)}}\log\left[\frac{1+|\omega(x_{r'}, y_{s'})-\omega(x_r, y_s)|^2/\delta_2^2}{}\right]\right\},$$

where P represents the posterior probability of the metabolite and magnetic field inhomogeneity images given the measured image signals, $E[S_n(x_r, y_s)]$ represents the expected value of the MR image signals at pixel (r, s), $\rho_j$ is the complex weight of the j-th metabolite component, $\omega(x_r, y_s)$ is the magnetic field inhomogeneity in the MRI system at point $(x_r, y_s)$, and, $\beta_1$, $\beta_2$, $\delta_1$, and $\delta_2$ act as non-negative parameters to scale (in the case of $\delta_1$, $\delta_2$) or to balance (in the case of $\beta_1$, $\beta_2$) the relative influence of the measured and a priori information on the solution. The symbol $\partial_{(r,s)}$ denotes the second order neighboring pixels of pixel (r,s), and $\sigma^2$ denotes the signal noise variance. The noise variance $\sigma^2$ is estimated by using a minimum variance unbiased estimator from the measured signals in a background or approximately homogeneous region of interest (ROI). The a posteriori expression of Eqn. 5 above can be used to estimate the metabolite and magnetic field inhomogeneity images by considering, for example, either the mode or the mean values. These mode or mean values of the metabolite and magnetic field inhomogeneity images can be computed, for example, using Markov chain Monte Carlo (MCMC) algorithms, which approximate such values based on the posterior distribution. To save computation time, only the contribution of pixels in a region of interest (ROI) is considered.

Alternatively, a probabilistic mathematical expression, when the phase is not assumed to be linearly dependent on a pixel coordinate along the readout gradient direction, may also be generated to reconstruct MR images of the metabolites for each point $(x_r, y_s)$ in an image. Such a free phase probabilistic Bayesian image expression is given as:

$$P\left(\begin{array}{c} \rho(x_1, y_1), \omega(x_1, y_1), \varphi(x_1, y_1), \ldots, \\ \rho(x_{n_p}, y_{n_p}), \omega(x_{n_p}, y_{n_p}), \varphi(x_{n_p}, y_{n_p}) \\ |S_1(x_1, y_1), \ldots, S_1(x_{n_p}, y_{n_p}), \ldots, \\ S_N(x_1, y_1), \ldots, S_N(x_{n_p}, y_{n_p}) \end{array}\right) \quad \text{(Eqn. 6)}$$

$$\propto \prod_{n=1}^{N}\prod_{r=1}^{n_p}\prod_{s=1}^{n_p}\exp-|S_n(x_r, y_s) - E[S_n(x_r, y_s)]|^2/2$$

$$\sigma^2 \cdot \prod_{j=1}^{m}\exp\left\{-\beta_1\sum_{(r',s')\in\partial_{(r,s)}}\log\left[\frac{1+|\rho_j(x_{r'}, y_{s'})-\rho_j(x_r, y_s)|^2/\delta_1^2}{}\right]\right\}\cdot\exp$$

$$\left\{-\beta_2\sum_{(r',s')\in\partial_{(r,s)}}\log\left[\frac{1+|\omega(x_{r'}, y_{s'})-\omega(x_r, y_s)|^2/\delta_2^2}{}\right]\right\},$$

where P again represents the posterior probability of the metabolite and magnetic field inhomogeneity images given the measured image signals. Aside from the free phase factor $\phi(x, y)$, the probabilistic Bayesian image expression of Eqn. 6 is identical to that of Eqn. 5 above.

As noted above, the parameters, or "hyper-parameters", $\beta_1$, $\beta_2$, $\delta_1$, and $\delta_2$ act as non-negative parameters to scale (in the case of $\delta_1$, $\delta_2$) or to balance (in the case of $\beta_1$, $\beta_2$) the relative influence of the measured and a priori information on the solution. The hyper-parameters $\beta_2$ and $\delta_2$, for example, can be determined by optimizing the estimation obtained on a trained set of images. It can be assumed that the magnetic field inhomogeneity ($\omega$) is minimal and has similar space variation for different images. For this reason, using a trained data set to estimate the values of $\beta_2$ and $\delta_2$ is sufficient in many circumstances.

On the other hand, the values of hyper-parameters $\beta_1$ and $\delta_1$ are estimated automatically and separately for each measured image data set. First, in a suitable region of interest (ROI), the empirical distribution $f(\Delta\rho)$ of the differences between metabolite images estimated with $\beta_1=0$ in neighboring pixels is computed. Subsequently, the value of the scaling parameter $\delta_1$ is determined by minimizing the quantity:

$$\|f(\Delta\rho) - C/[1 + |\Delta\rho|^2/\delta_1^2]\|. \quad \text{(Eqn. 7)}$$

The parameter $\beta_1$ is determined by computing the empirical distribution $f(SSE_{\beta_1})$ of the sum of squared errors (SSE) of the differences between the measured MR image signal and the estimated MR image signal, corresponding to different values of $\beta_1$, which is given as:

$$SSE_{\beta_1} = \Sigma_{n=1}^N [S_n(x_r, y_s) - \hat{E}[S_n(x_r, y_s)](\beta_1)]^2 / \sigma^2 \quad \text{(Eqn. 8)}$$

in a suitable region of interest (ROI) R where measured signal averages along time is significantly different from zero. The value of $\beta_1$ is then determined by minimizing the quantity:

$$\|f(SSE_{\beta_1}) - \chi^2(SSE)\|, \quad \text{(Eqn. 9)}$$

where $\chi^2$ is the theoretical Chi-squared distribution with unknown degrees of freedom. In this way, the parameters $\beta_1$ can be determined for each measured data set. Further, while it is discussed above that the values of hyper-parameters $\beta_2$ and $\delta_2$ are estimated using a trained data set, $\beta_2$ and $\delta_2$ may also be estimated automatically and separately for each measured image data set using a similar approach as that set forth for calculating the values of hyper-parameters $\beta_1$ and $\delta_1$. This is described further below with respect to FIG. 2.

After hyper-parameters, $\beta_1$, $\beta_2$, $\delta_1$, and $\delta_2$ are determined, their values are used to respectively balance and scale the influence of the measured and a priori information on the solution of the probabilistic Bayesian image expression. Thus, MR images of the metabolites for each point $(x_r, y_s)$ in an image are reconstructed using the probabilistic Bayesian image expression set forth in one of Eqns. 5 and 6 above. The reconstructed image may have substantially reduced image artifacts normally attributable to conventional reconstruction methods of such multi-echo data. Furthermore, image spatial regularity is also increased. Accordingly, the Bayesian approach presented above represents an image reconstruction method that greatly improves image quality without the necessity of acquiring more image data.

Figure 2:
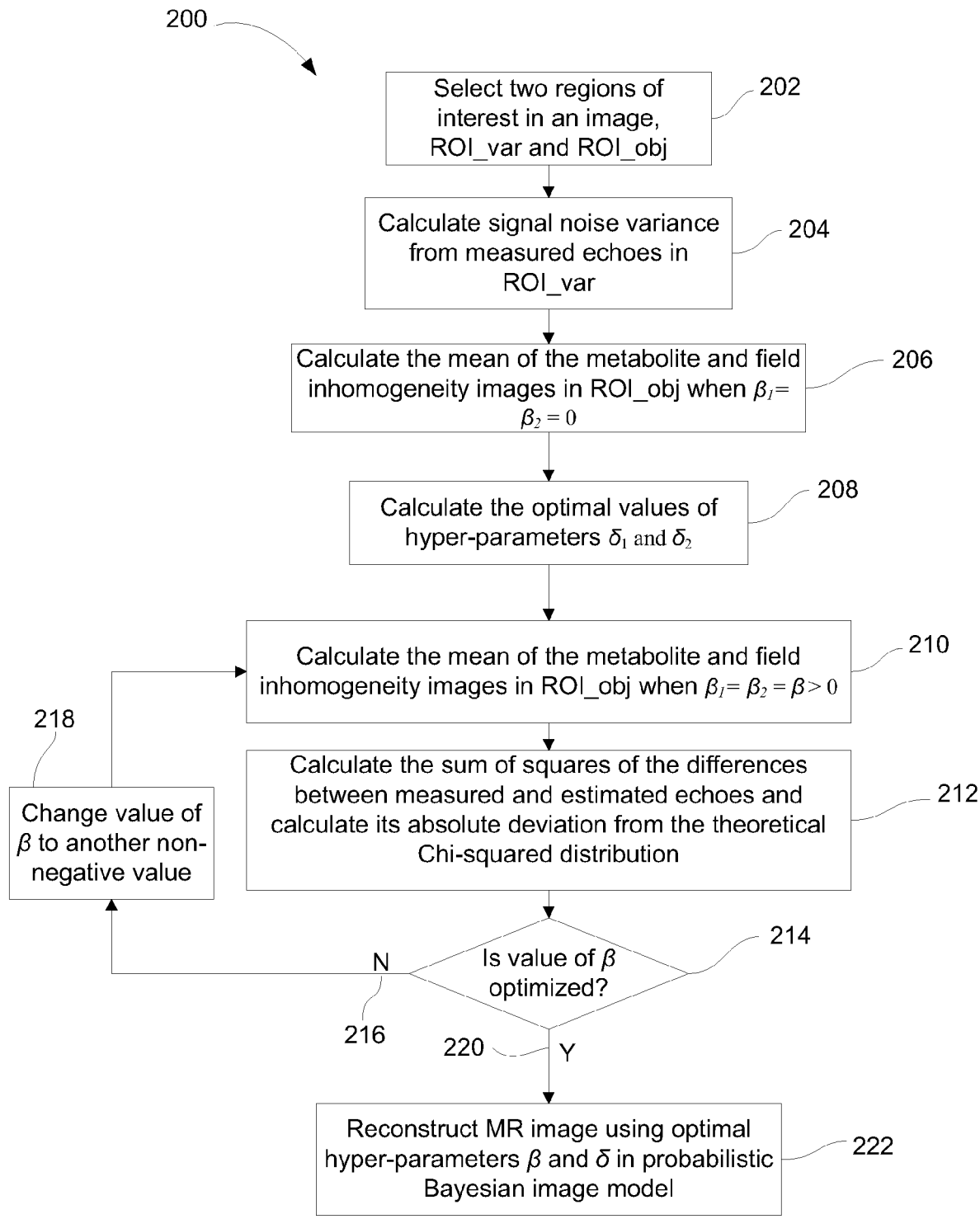
FIG. 2 is a flow chart illustrating an exemplary MR imaging method in accordance with an embodiment of the invention.

Referring now to FIG. 2, an imaging technique 200 in accordance with an embodiment of the present invention is shown. Technique 200 begins with selecting, at block 202, two regions of interest related to the object to be imaged. One region of interest, ROI_var, encompasses an image background or homogenous region in the image to enable a signal noise variance $\sigma^2$ to be determined. Another region of interest, ROI_obj, is selected to encompass the image region to be processed and reconstructed. These regions of interest may be selected automatically or by a user via a graphic interface. Following the selection of the two regions of interest, a minimum variance unbiased estimator is computed for the signal noise variance $\sigma^2$ at block 204. The measured echoes in the region of interest ROI_var are used to compute signal noise variance $\sigma^2$.

Imaging technique 200 then determines, at block 206, the mean of the metabolite and field inhomogeneity images based on the signal likelihood probability distribution in the specified region of interest ROI_obj. The signal likelihood probability distribution is determined by setting hyper-parameters $\beta_1$ and $\beta_2$ equal to zero ($\beta_1=\beta_2=0$) and using Monte Carlo Markov Chain simulation algorithms such that estimates of the images are obtained based upon the acquired image data. Next, at block 208, the optimal values of hyper-parameters $\delta_1$ and $\delta_2$ are determined using the estimated metabolite and field inhomogeneity image data calculated in block 206. That is, in a suitable region of interest ROI_obj, the empirical distribution of the differences between both metabolite images and field inhomogeneity images estimated with $\beta_1=\beta_2=0$ in neighboring pixels is computed. The empirical distribution of the differences between the metabolite images and field inhomogeneity images are then fit to a parametric model to find optimal values for hyper-parameters $\delta_1$ and $\delta_2$, as is shown above with respect to Eqn. 7.

Still referring to FIG. 2, imaging technique 200 next determines, at block 210, the mean of the metabolite and field inhomogeneity images in the specified region of interest (ROI_obj) based on their posterior distribution with $\beta_1$ and $\beta_2$ set to a value greater than zero ($\beta_1=\beta_2=\beta>0$). For example, $\beta$ may have an initial value of one. Then, at block 212, the empirical distribution of the sum of squares of the differences between the measured and estimated echoes are calculated for the specified region of interest ROI_obj, as shown above in Eqn. 8. The absolute deviation of the empirical distribution of the sum of squares is then calculated with respect to a theoretical $\chi^2$ distribution having free degrees of freedom, as shown in Eqn. 9. At block 214, it is determined if the value of the hyper-parameter $\beta$ is optimized based on the calculation at block 212. If not 216, then the value of hyper-parameter $\beta$ is changed to another non-negative value at block 218 and the steps of blocks 210-214 are repeated until an optimal $\beta$ value is found. The optimal $\beta$ value is the value that minimizes the discrepancy between the empirical distribution of the sum of squares of the differences between the measured and estimated echoes and the theoretical $\chi^2$ distribution. If the value of the hyper-parameter $\beta$ is optimized 220, hyper-parameters $\beta_1$, $\beta_2$, $\delta_1$, and $\delta_2$ are incorporated with the probabilistic Bayesian image model to enable reconstruction of an MR image having reduced image artifacts at block 222.

A technical contribution for the disclosed method and apparatus is that it provides for a computer implemented to perform image reconstruction of multi-echo MR data using a probabilistic mathematical expression to generate an MR image having both reduced image artifacts and increased regularity.

Therefore, the invention includes an MR imaging apparatus which includes a plurality of gradient coils positioned about a bore of a magnet, and an RF transceiver system controlled by a pulse module to transmit RF signals to an RF coil assembly. The MR imaging apparatus also includes a controller coupled to the plurality of gradient coils and the RF transceiver system and programmed to obtain MR image signals at different echo times from a subject containing metabolites having known characteristics. The controller is further programmed to reconstruct images of the metabolites in a selected region of interest (ROI) using a probabilistic mathematical expression based on known information regarding an image acquisition process and using a spatial distribution of the metabolites to account for artifacts in the images.

A method of MR imaging is also disclosed, the method comprising selecting a region of interest (ROI) of a subject to be imaged, the selected ROI comprising metabolites having known characteristics, obtaining MR image signals at different echo times from the selected ROI, and reconstructing images of the metabolites in the selected ROI via a probabilistic mathematical expression using known information regarding an image acquisition process and using a spatial distribution of the metabolites to account for artifacts in the images.

The invention also includes a computer readable storage medium having stored thereon a computer program comprising instructions, which, when executed by a computer, cause the computer to obtain an MR signal matrix from an object comprising metabolites having known characteristics, reconstruct an image of the metabolites using a probabilistic mathematical expression based on known information regarding an image acquisition process and incorporating a spatial distribution of the metabolites to account for artifacts in the images.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
a plurality of gradient coils positioned about a bore of a magnet, and an RF transceiver system controlled by a pulse module to transmit RF signals to an RF coil assembly; and
a controller coupled to the plurality of gradient coils and the RF transceiver system and programmed to:
obtain MR image signals at different echo times from a subject containing metabolites having known characteristics; and
reconstruct images of the metabolites in a selected region of interest (ROI) using a probabilistic mathematical expression based on known information regarding an image acquisition process and using a spatial distribution of the metabolites to account for artifacts in the images.

2. The MRI apparatus of claim 1 wherein a measured MR image signal $S_n(x, y)$ at point $(x, y)$ is given by the equation:

$$S_n(x, y) = \sum_{j=1}^{m} \rho_j(x + \xi_n(\omega_j), y) \exp\left\{ \begin{array}{l} it_n\omega_j + it_n\omega(x + \xi_n(\omega_j), y) + \\ ik[(x + \xi_n(\omega_j))]\left(\frac{1+(-1)^n}{2}\right) \end{array} \right\} + \epsilon_n(x, y),$$

where $\rho_j$ is the complex weight of the j-th metabolite component, $\omega_j$ is the known frequency of the j-th metabolite, $n=1, \ldots, N$, and N is the total number of echoes, $t_n$ is the echo time, and $\xi_n(\omega_j)$ represents a chemical shift artifact, while $\omega$ is due to magnetic field inhomogeneity in the MRI system.

3. The MRI apparatus of claim 2 wherein the term representing the chemical shift artifact $\xi_n(\omega_j)$ is given as:

$$\xi_n(\omega_j) = -C(-1)^n(\omega_j - \omega_{j0}),$$

where $C \geq 0$ and where C is known.

4. The MRI apparatus of claim 1 wherein an estimated MR image signal $E[S_n(x_r, y_s)]$ at point $(x_r, y_s)$ is given by the equation:

$$E[S_n(x_r, y_s)] = \exp\left\{i\left[t_n\omega(x_r, y_s) + x_r\left(\frac{1+(-1)^n}{2}\right)k\right]\right\} \sum_{j=1}^{m} \rho_j(x_r, y_s)\exp(it_n\omega_j),$$

where $t_n$ is the echo time, $\rho_j$ is the complex weight of the j-th metabolite component, $\omega_j$ is the known frequency of the j-th metabolite, $n=1, \ldots, N$, and N is the total number of echoes, and $\omega(x_r, y_s)$ is the magnetic field inhomogeneity in the MRI system at point $(x_r, y_s)$.

5. The MRI apparatus of claim 4 wherein accounting for the image artifacts related to for the time shift between even and odd echoes is given by the term:

$$x_r\left(\frac{1+(-1)^n}{2}\right)k,$$

the term being linearly dependent on a pixel coordinate along a readout gradient direction.

6. The MRI apparatus of claim 4 wherein the probabilistic mathematical expression to reconstruct images of the metabolites is given as:

$$P\left(\begin{array}{l} \rho(x_1, y_1), \omega(x_1, y_1), \ldots, \rho(x_{n_p}, y_{n_p}), \omega(x_{n_p}, y_{n_p}), \\ k \mid S_1(x_1, y_1), \ldots, S_1(x_{n_p}, y_{n_p}), \ldots, \\ S_N(x_1, y_1), \ldots, S_N(x_{n_p}, y_{n_p}) \end{array}\right) \propto$$

$$\prod_{n=1}^{N} \prod_{r=1}^{n_p} \prod_{s=1}^{n_p} \exp{-|S_n(x_r, y_s) - E[S_n(x_r, y_s)]|^2/2}$$

$$\sigma^2 \cdot \prod_{j=1}^{m} \exp\left\{-\beta_1 \sum_{(r',s') \in \partial_{(r,s)}} \log\left[\frac{1 + |\rho_j(x_{r'}, y_{s'}) -}{\rho_j(x_r, y_s)|^2/\delta_1^2}\right]\right\} \cdot \exp$$

$$\left\{-\beta_2 \sum_{(r',s') \in \partial_{(r,s)}} \log\left[\frac{1 + |\omega(x_{r'}, y_{s'}) -}{\omega(x_r, y_s)|^2/\delta_2^2}\right]\right\},$$

where P represents the posterior probability distribution, $S_n(x_r, y_s)$, represents the acquired MR image signals at pixel (r, s), $E[S_n(x_r, y_s)]$ the estimated MR image signals at pixel (r, s), $\rho_j$ is the complex weight of the j-th metabolite component, $\omega(x_r, y_s)$ is the magnetic field inhomogeneity in the MRI system at point $(x_r, y_s)$, and $\beta_1, \beta_2, \delta_1$, and $\delta_2$ are parameters.

7. The MRI apparatus of claim 6 wherein one of the mean values and the mode values of the metabolite and magnetic field inhomogeneity images are calculated using Markov chain Monte Carlo (MCMC) algorithms.

8. The MRI apparatus of claim 6 wherein the controller is further programmed to automatically estimate the scaling parameter $\delta_1$ for each measured image data set, the value of $\delta_1$ being determined by minimizing the quantity:

$$\|f(\Delta\rho) - C/[1+|\Delta\rho|^2/\delta_1^2]\|,$$

where $f(\Delta \rho)$ is the estimated empirical distribution in the region of interest R of the differences between metabolic image values in neighbor pixels estimated with $\beta_1 = \beta_2 = 0$.

9. The MRI apparatus of claim 6 wherein the controller is further programmed to automatically estimate the scaling parameter $\beta_1$ for each measured image data set, the estimation comprising an empirical distribution of the sum of squared errors of the differences between the acquired MR image signals and the estimated MR image signals given as:

$$SSE_{\beta_1} = \sum_{n=1}^{N} \left[ S_n(x_r, y_s) - \hat{E}[S_n(x_r, y_s)](\beta_1) \right]^2 / \sigma^2$$

in the region of interest, and wherein the value of fi is determined by minimizing the quantity:

$$\|f(SSE_{\beta_c}) - \chi^2(SSE)\|,$$

where $\chi^2$ is the Chi-squared distribution with unknown degrees of freedom.

10. The MRI apparatus of claim 6 wherein the controller is further programmed to estimate the values of $\beta_2$ and $\delta_2$ by optimizing an estimation obtained on a training set of images.

11. The MRI apparatus of claim 1 wherein an estimated MR image signal $E[S_n(x_r, y_s)]$ at point $(x_r, y_s)$ is given by the equation:

$$E[S_n(x_r, y_s)] = \exp\left\{ i \left[ t_n \omega(x_r, y_s) + \varphi(x_r, y_s) \left( \frac{1+(-1)^n}{2} \right) \right] \right\} \sum_{j=1}^{m} \rho_j(x_r, y_s) \exp(it_n \omega_j),$$

where $t_n$ is the echo time, $\rho_j$ is the complex weight of the j-th metabolite component, $\omega_j$ is the known frequency of the j-th metabolite, $n = 1, \ldots, N$, and N is the total number of echoes, $\omega(x_r, y_s)$ is the magnetic field inhomogeneity in the MRI system at point $(x_r, y_s)$, and $\phi(x_r, y_s)$ represents a free phase factor to account for odd-even echoes artifacts.

12. The MRI apparatus of claim 11 wherein the probabilistic mathematical expression to reconstruct images of the metabolites is given as:

$$P\begin{pmatrix} \rho(x_1, y_1), \omega(x_1, y_1), \varphi(x_1, y_1), \ldots, \\ \rho(x_{n_p}, y_{n_p}), \omega(x_{n_p}, y_{n_p}), \varphi(x_{n_p}, y_{n_p}) \\ |S_1(x_1, y_1), \ldots, S_1(x_{n_p}, y_{n_p}), \ldots, \\ S_N(x_1, y_1), \ldots, S_N(x_{n_p}, y_{n_p}) \end{pmatrix}$$

$$\propto \prod_{n=1}^{N} \prod_{r=1}^{n_p} \prod_{s=1}^{n_p} \exp - |S_n(x_r, y_s) - E[S_n(x_r, y_s)]|^2 / 2$$

$$\sigma^2 \cdot \prod_{j=1}^{m} \exp\left\{ -\beta_1 \sum_{(r', s') \in \partial(r,s)} \log\left[ \frac{1 + |\rho_j(x_{r'}, y_{s'}) - \rho_j(x_r, y_s)|^2 / \delta_1^2} \right] \right\} \cdot \exp\left\{ -\beta_2 \sum_{(r', s') \in \partial(r,s)} \log\left[ \frac{1 + |\omega(x_{r'}, y_{s'}) - \omega(x_r, y_s)|^2 / \delta_2^2} \right] \right\},$$

where P represents the posterior probability distribution, $S_n(x_r, y_s)$, represents the acquired MR image signals at pixel (r, s), $E[S_n(x_r, y_s)]$ the estimated MR image signals at pixel (r, s), $\rho_j$ is the complex weight of the j-th metabolite component, $\omega(x_r, y_s)$ is the magnetic field inhomogeneity in the MRI system at point $(x_r, y_s)$, $\phi(x_r, y_s)$ is a free phase factor, and $\beta_1$, $\beta_2$, $\delta_1$, $\delta_1$, and $\delta_2$ are parameters.

13. A method of MR imaging comprising:

selecting a region of interest (ROI) of a subject to be imaged, the selected ROI comprising metabolites having known characteristics;

obtaining MR image signals at different echo times from the selected ROI; and reconstructing images of the metabolites in the selected ROI via a probabilistic mathematical expression using known information regarding an image acquisition process and using a spatial distribution of the metabolites to account for artifacts in the images.

14. The method of claim 13 wherein the known characteristics of the metabolites comprise a complex weight and a resonance frequency of each metabolite.

15. The method of claim 13 further comprising accounting for artifacts related to a time shift between even echoes and odd echoes in multi-echo data.

16. The method of claim 13 further comprising determining scaling parameters and balancing parameters using at least the measured MR signals.

17. The method of claim 13 further comprising accounting for artifacts attributable to phase shifts and spatial shifts.

18. A non-transitory computer readable storage medium having stored thereon a computer program comprising instructions, which, when executed by a computer, cause the computer to:

obtain an MR signal matrix from an object comprising metabolites having known characteristics; and reconstruct an image of the metabolites using a probabilistic mathematical expression based on known information regarding an image acquisition process and incorporating a spatial distribution of the metabolites to account for artifacts in the images.

19. The non-transitory computer readable storage medium of claim 18 having further instructions that cause the computer to calculate scaling parameters and balancing parameters based on the measured MR signals in the region of interest.

20. The non-transitory computer readable storage medium of claim 18 wherein determining an MR image signal $S_n(x, y)$ at each point (x, y) comprises solving the equation:

$$S_n(x, y) = \sum_{j=1}^{m} \rho_j(x + \xi_n(\omega_j), y) \exp\left\{ \begin{array}{l} it_n\omega_j + it_n\omega(x + \xi_n(\omega_j), y) + \\ ik[(x + \xi_n(\omega_j))]\left(\frac{1 + (-1)^n}{2}\right) \end{array} \right\} + \epsilon_n(x, y),$$

where $\rho_j$ is the complex weight of a j-th species, $\omega_j$ is the known frequency of the j-th species, n=1, ..., N, and N is the total number of echoes, $t_n$ is the echo time, and $\xi_n(\omega_j)$ is the chemical shift.

21. The non-transitory computer readable storage medium of claim 18 wherein the probabilistic mathematical expression uses an estimated MR image signal to reconstruct an image, wherein determining the estimated MR image signal $E[S_n(x_r, y_s)]$ at each point $(x_r, y_s)$ comprises solving the equation:

$$E[S_n(x_r, y_s)] = \exp\left\{ i\left[ t_n\omega(x_r, y_s) + x_r\left(\frac{1 + (-1)^n}{2}\right)k \right] \right\} \sum_{j=1}^{m} \rho_j(x_r, y_s) \exp(it_n\omega_j),$$

where $t_n$ is the echo time, $\rho_j$ is the complex weight of the j-th species, $\omega_j$ is the known frequency of the j-th species, n=1, ..., N, and N is the total number of echoes, and $\omega(x_r, y_s)$ is the magnetic field inhomogeneity at point $(x_r, y_s)$.

22. The non-transitory computer readable storage medium of claim 18 wherein the probabilistic mathematical expression comprises solving:

$$P\left( \begin{array}{l} \rho(x_1, y_1), \omega(x_1, y_1), \ldots, \rho(x_{n_p}, y_{n_p}), \omega(x_{n_p}, y_{n_p}), \\ k \mid S_1(x_1, y_1), \ldots, S_1(x_{n_p}, y_{n_p}), \ldots, \\ S_N(x_1, y_1), \ldots, S_N(x_{n_p}, y_{n_p}) \end{array} \right)$$

$$\propto \prod_{n=1}^{N} \prod_{r=1}^{n_p} \prod_{s=1}^{n_p} \exp - |S_n(x_r, y_s) - E[S_n(x_r, y_s)]|^2 / 2$$

$$\sigma^2 \cdot \prod_{j=1}^{m} \exp\left\{ -\beta_1 \sum_{(r', s') \in \partial(r,s)} \log\left[\frac{1 + |\rho_j(x_{r'}, y_{s'}) - \rho_j(x_r, y_s)|^2 / \delta_1^2}{}\right] \right\} \cdot \exp\left\{ -\beta_2 \sum_{(r', s') \in \partial(r,s)} \log\left[\frac{1 + |\omega(x_{r'}, y_{s'}) - \omega(x_r, y_s)|^2 / \delta_2^2}{}\right] \right\},$$

where P represents the posterior probability distribution, $S_n(x_r, y_s)$ represents the acquired MR image signals at pixel (r, s), $E[S_n(x_r, y_s)]$ represents the estimated MR image signals at pixel (r, s), $\rho_j$ is the complex weight of the j-th species, $\omega(x_r, y_s)$ is the magnetic field inhomogeneity at point $(x_r, y_s)$, and $\beta_1, \beta_2, \delta_1,$ and $\delta_2$ are scaling parameters.

23. The non-transitory computer readable storage medium of claim 18 wherein the probabilistic mathematical expression uses an estimated MR image signal to reconstruct an image, wherein determining the estimated MR image signal $E[S_n(x_r, y_s)]$ at each point $(x_r, y_s)$ comprises solving the equation:

$$E[S_n(x_r, y_s)] = \exp\left\{ i\left[ t_n\omega(x_r, y_s) + \varphi(x_r, y_s)\left(\frac{1 + (-1)^n}{2}\right) \right] \right\} \sum_{j=1}^{m} \rho_j(x_r, y_s) \exp(it_n\omega_j),$$

where $t_n$ is the echo time, $\rho_j$ is the complex weight of the j-th metabolite component, $\omega_j$ is the known frequency of the j-th metabolite, n=1, ..., N, and N is the total number of echoes, $\omega(x_r, y_s)$ is the magnetic field inhomogeneity in the MRI system at point $(x_r, y_s)$, and $\phi(x_r, y_s)$ represents a free phase factor to account for odd-even echoes artifacts.

24. The non-transitory computer readable storage medium of claim 18 wherein the probabilistic mathematical expression comprises solving:

$$P\left( \begin{array}{l} \rho(x_1, y_1), \omega(x_1, y_1), \varphi(x_1, y_1), \ldots, \\ \rho(x_{n_p}, y_{n_p}), \omega(x_{n_p}, y_{n_p}), \varphi(x_{n_p}, y_{n_p}) \\ k \mid S_1(x_1, y_1), \ldots, S_1(x_{n_p}, y_{n_p}), \ldots, \\ S_N(x_1, y_1), \ldots, S_N(x_{n_p}, y_{n_p}) \end{array} \right)$$

$$\propto \prod_{n=1}^{N} \prod_{r=1}^{n_p} \prod_{s=1}^{n_p} \exp - |S_n(x_r, y_s) - E[S_n(x_r, y_s)]|^2 / 2$$

$$\sigma^2 \cdot \prod_{j=1}^{m} \exp\left\{ -\beta_1 \sum_{(r', s') \in \partial(r,s)} \log\left[\frac{1 + |\rho_j(x_{r'}, y_{s'}) - \rho_j(x_r, y_s)|^2 / \delta_1^2}{}\right] \right\} \cdot \exp\left\{ -\beta_2 \sum_{(r', s') \in \partial(r,s)} \log\left[\frac{1 + |\omega(x_{r'}, y_{s'}) - \omega(x_r, y_s)|^2 / \delta_2^2}{}\right] \right\},$$

where P represents posterior probability distribution, $S_n(x_r, y_s)$, represents the acquired MR image signals at pixel (r, s), $E[S_n(x_r, y_s)]$ the estimated MR image signals at pixel (r, s), $\rho_j$ is the complex weight of the j-th metabolite component, $\omega(x_r, y_s)$ is the magnetic field inhomogeneity in the MRI system at point $(x_r, y_s)$, $\phi(x_r, y_s)$ is a free phase factor, and $\beta_1, \beta_2, \delta_1,$ and $\delta_2$ are parameters.

* * * * *

UNITED STATES PATENT AND TRADEMARK OFFICE
CERTIFICATE OF CORRECTION

PATENT NO. : 7,952,355 B2
APPLICATION NO. : 12/362560
DATED : May 31, 2011
INVENTOR(S) : Torheim et al.

It is certified that error appears in the above-identified patent and that said Letters Patent is hereby corrected as shown below:

Col. 11, line 24 (Claim 9), delete "value of fi is" and substitute therefore -- value of $\beta_1$ is --.

Col. 14, lines 30-34 (Claim 24), delete $$P\begin{pmatrix} \rho(x_1, y_1), \omega(x_1, y_1), \varphi(x_1, y_1), \ldots, \\ \rho(x_{n_p}, y_{n_p}), \omega(x_{n_p}, y_{n_p}), \varphi(x_{n_p}, y_{n_p}) \\ k \mid S_1(x_1, y_1), \ldots, S_1(x_{n_p}, y_{n_p}), \ldots, \\ S_N(x_1, y_1), \ldots, S_N(x_{n_p}, y_{n_p}) \end{pmatrix}$$

and substitute therefore $$P\begin{pmatrix} \rho(x_1, y_1), \omega(x_1, y_1), \varphi(x_1, y_1), \ldots, \rho(x_{n_p}, y_{n_p}), \omega(x_{n_p}, y_{n_p}), \varphi(x_{n_p}, y_{n_p}) \\ \mid S_1(x_1, y_1), \ldots, S_1(x_{n_p}, y_{n_p}), \\ \ldots, S_N(x_1, y_1), \ldots, S_N(x_{n_p}, y_{n_p}) \end{pmatrix}$$

Signed and Sealed this
Sixteenth Day of August, 2011

David J. Kappos
*Director of the United States Patent and Trademark Office*